(12) United States Patent
Li et al.

(10) Patent No.: US 11,183,622 B2
(45) Date of Patent: Nov. 23, 2021

(54) MICRO LIGHT-EMITTING DEVICE MODULE

(71) Applicant: PlayNitride Display Co., Ltd., MiaoLi County (TW)

(72) Inventors: Yun-Li Li, MiaoLi County (TW); Tzu-Yang Lin, MiaoLi County (TW); Yu-Hung Lai, MiaoLi County (TW); Pei-Hsin Chen, MiaoLi County (TW); Yi-Chun Shih, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 21 days.

(21) Appl. No.: 16/716,509

(22) Filed: Dec. 17, 2019

(65) Prior Publication Data

US 2021/0125970 A1 Apr. 29, 2021

(30) Foreign Application Priority Data

Oct. 24, 2019 (TW) .................................. 108138394

(51) Int. Cl.
*H01L 33/62* (2010.01)
*H01L 25/075* (2006.01)
*H01L 33/48* (2010.01)

(52) U.S. Cl.
CPC .......... *H01L 33/62* (2013.01); *H01L 25/0753* (2013.01); *H01L 33/486* (2013.01)

(58) Field of Classification Search
CPC .... H01L 25/0753; H01L 33/62; H01L 33/486
See application file for complete search history.

(56) References Cited

U.S. PATENT DOCUMENTS

2014/0159064 A1* 6/2014 Sakariya ................. H01L 33/60
257/88
2014/0167036 A1* 6/2014 Cheng ............... H01L 29/78621
257/43

FOREIGN PATENT DOCUMENTS

| EP | 2579343 | 4/2013 |
| TW | 201626600 | 7/2016 |
| TW | 201724556 | 7/2017 |

OTHER PUBLICATIONS

"Office Action of Taiwan Counterpart Application", dated May 18, 2020, p. 1-p. 5.

* cited by examiner

*Primary Examiner* — Feifei Yeung Lopez
(74) *Attorney, Agent, or Firm* — JCIPRNET (57) ABSTRACT

A micro light-emitting device module includes a circuit substrate, a planarization layer and a micro light-emitting device. The planarization layer is disposed on an upper surface of the circuit substrate and has a first surface and a second surface opposite to each other. The second surface is in contact with the upper surface of the circuit substrate. The micro light-emitting device is disposed on the first surface of the planarization layer. A maximum height difference of the second surface of the planarization layer is greater than a thickness of the micro light-emitting device.

20 Claims, 7 Drawing Sheets

MICRO LIGHT-EMITTING DEVICE MODULE

CROSS-REFERENCE TO RELATED APPLICATION

This application claims the priority benefit of Taiwan application serial no. 108138394, filed on Oct. 24, 2019. The entirety of the above-mentioned patent application is hereby incorporated by reference herein and made a part of this specification.

BACKGROUND

Technical Field

The disclosure relates to a micro light-emitting device module, and in particular, to a micro light-emitting device module with good reliability.

Description of Related Art

With the development of an optoelectronic technology, volumes of many optoelectronic elements are gradually miniaturized. In recent years, due to a breakthrough in a manufacture size of a light-emitting diode (LED), the light-emitting diode can be applied not only to a lighting technology but also to manufacture of a display panel. At present, a micro light-emitting device (micro-LED) display in which light-emitting diodes are arranged in arrays is gradually valued in the market. A micro light-emitting diode display is an active light-emitting diode display. Compared to an organic light-emitting diode (OLED) display, the micro light-emitting diode display is more power-saving, has better contrast performance, and may be visible in the sun. In addition, because the micro light-emitting diode display is made of an inorganic material, the micro light-emitting diode display has better reliability and a longer service life than the organic light-emitting diode display. For a micro light-emitting device module including a micro light-emitting device, how to improve reliability is a research objective in the field.

SUMMARY

The disclosure provides a micro light-emitting device module with good reliability.

A micro light-emitting device module of the disclosure includes a circuit substrate, a planarization layer, and a micro light-emitting device. The planarization layer is disposed on an upper surface of the circuit substrate and has a first surface and a second surface opposite to each other. The second surface is in contact with the upper surface of the circuit substrate. The micro light-emitting device is disposed on the first surface of the planarization layer. A maximum height difference of the second surface of the planarization layer is greater than a thickness of the micro light-emitting device.

In an embodiment of the disclosure, the maximum height difference of the second surface of the planarization layer is greater than a maximum height difference of the first surface of the planarization layer.

In an embodiment of the disclosure, a ratio of the maximum height difference of the first surface of the planarization layer to the maximum height difference of the second surface of the planarization layer is less than or equal to 0.1.

In an embodiment of the disclosure, a maximum height difference of the first surface of the planarization layer is less than the thickness of the micro light-emitting device.

In an embodiment of the disclosure, a ratio of the thickness of the micro light-emitting device to the maximum height difference of the second surface of the planarization layer is less than 0.5.

In an embodiment of the disclosure, the maximum height difference of the second surface of the planarization layer is greater than a width of the micro light-emitting device.

In an embodiment of the disclosure, the micro light-emitting device module further includes a conductive structure electrically connected to the circuit substrate and the micro light-emitting device. The conductive structure includes a first pad disposed on the upper surface of the circuit substrate and located in a via of the planarization layer, the first pad being connected to a second pad of the first surface of the planarization layer in the via, and the first pad and the second pad being not integrally formed.

In an embodiment of the disclosure, a material of the first pad is different from a material of the second pad.

In an embodiment of the disclosure, a resistance of the first pad is greater than that of the second pad.

In an embodiment of the disclosure, a ratio of an area of a projection of the second pad onto the circuit substrate to an area of a projection of the first pad onto the circuit substrate is greater than 1 and less than or equal to 10.

In an embodiment of the disclosure, the micro light-emitting device includes a third pad electrically connected to the second pad. An area of a projection of the second pad onto the circuit substrate is greater than an area of a projection of the third pad onto the circuit substrate, and the area of the projection of the third pad onto the circuit substrate is greater than an area of a projection of the first pad onto the circuit substrate.

In an embodiment of the disclosure, the planarization layer extends to a portion of a top surface of the first pad.

In an embodiment of the disclosure, an area of a projection of the second pad onto the circuit substrate is greater than an area of a projection of the first pad onto the circuit substrate, and the area of the projection of the first pad onto the circuit substrate is greater than an area of a projection of the via onto the circuit substrate.

In an embodiment of the disclosure, the second pad is recessed in or flush with the first surface of the planarization layer.

In an embodiment of the disclosure, the second pad covers the first pad.

In an embodiment of the disclosure, the micro light-emitting device includes a third pad electrically connected to the second pad, and the second pad includes a groove facing the third pad.

In an embodiment of the disclosure, a projection of the micro light-emitting device onto the circuit substrate does not overlap a projection of the via onto the circuit substrate.

In an embodiment of the disclosure, a projection of the micro light-emitting device onto the circuit substrate does not overlap a projection of the first pad onto the circuit substrate.

In an embodiment of the disclosure, the planarization layer includes at least two vias, and a length of one of the at least two vias that is close to an edge of the planarization layer is less than a length of one of the at least two vias that is far away from the edge of the planarization layer.

In an embodiment of the disclosure, a Young's modulus of the planarization layer is greater than a Young's modulus of the circuit substrate.

Based on the above, in the micro light-emitting device module of the disclosure, the planarization layer is disposed on the upper surface of the circuit substrate, and the second surface of the planarization layer is in contact with the upper surface of the circuit substrate. A contour of the second surface of the planarization layer corresponds to a contour of the upper surface of the circuit substrate (in other words, the maximum height difference of the second surface of the planarization layer is the same as a maximum height difference of the upper surface of the circuit substrate). Because the maximum height difference of the upper surface of the circuit substrate is greater than the thickness of the micro light-emitting device, it is quite difficult to directly dispose the micro light-emitting device on the circuit substrate. In the micro light-emitting device module of the disclosure, the planarization layer is disposed on the upper surface of the circuit substrate to reduce a height difference, reduce a difficulty in disposing the micro light-emitting device, and reduce a probability of damaging the micro light-emitting device.

DESCRIPTION OF THE EMBODIMENTS

A micro light-emitting diode described in a micro light-emitting diode device in the embodiments of the disclosure, as used herein, means that a light-emitting diode of which a size ranges from 1 micron to 100 microns. In some embodiments, the micro light-emitting diode may have a maximum width of one of 20 microns, 10 microns, or 5 microns. In some embodiments, the micro light-emitting diode may have a maximum height of one of less than 20 microns, 10 microns, or 5 microns. It should be understood that the embodiments of the disclosure are not necessarily limited thereto, and larger or smaller scales may be applied to aspects of some embodiments. A substrate may be, for example, a display substrate, a light-emitting substrate, a substrate having functional components such as thin film transistors or integrated circuits (ICs), or other types of circuit substrates, but is not limited thereto. Although some embodiments of the disclosure specifically describe a micro light-emitting diode including a p-n diode, it should be understood that the embodiments of the disclosure are not limited thereto. Other micro-semiconductor components may also be applied to some embodiments, including micro-semiconductor components capable of controlling execution of a predetermined electronic function (for example, diodes, transistors, and integrated circuits) or micro-semiconductor components having a photonic function (for example, laser diodes, and photodiodes). Microchips including circuits may also be applied to some of other embodiments of the disclosure, for example, microchips made of Si or SOI wafers and used for logic or memory applications, or microchips made of GaAs wafers and used for RF communication applications.

Figure 1:
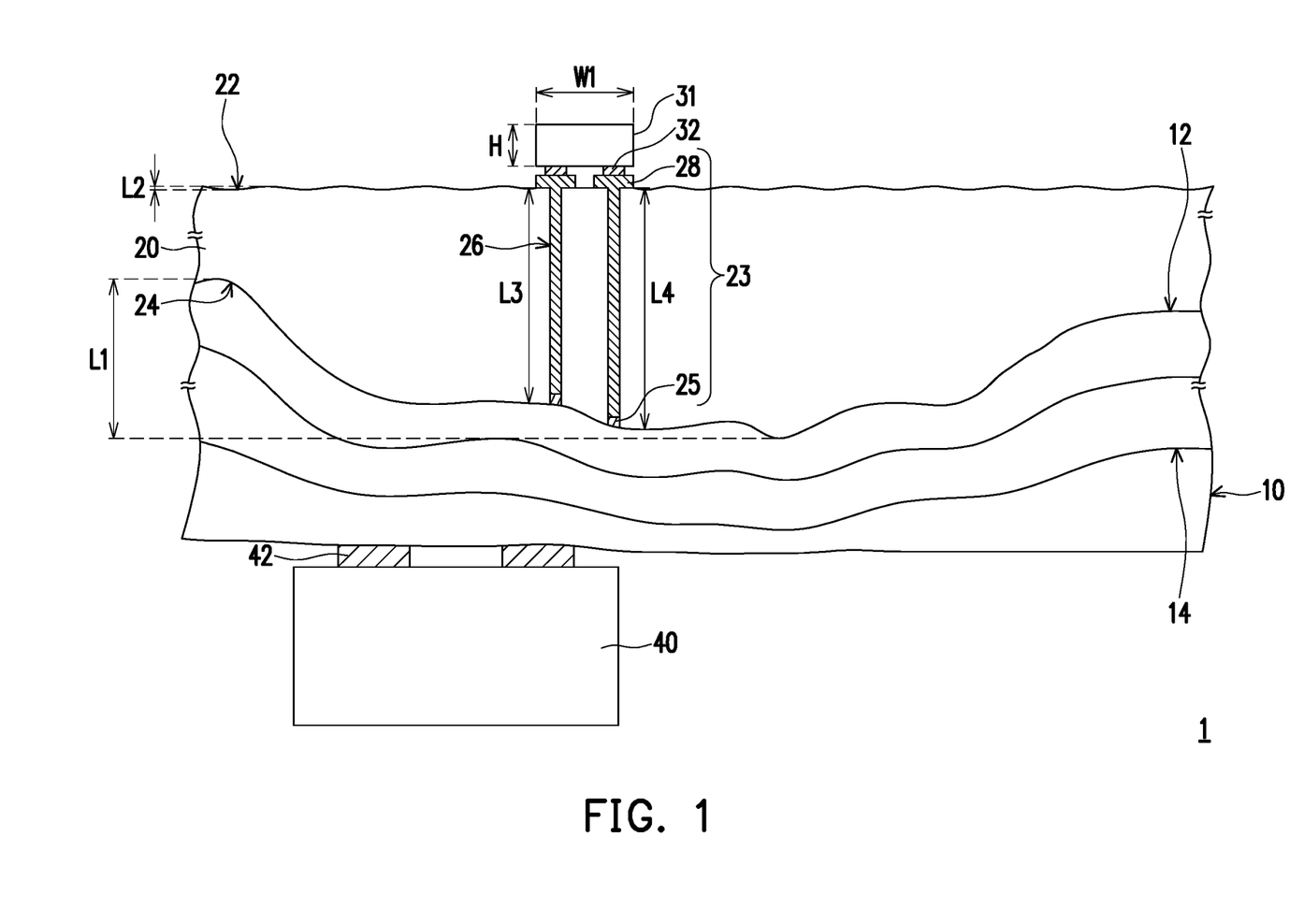
FIG. 1 is a partial schematic cross-sectional diagram of a micro light-emitting device module according to an embodiment of the disclosure.
Figure 2:
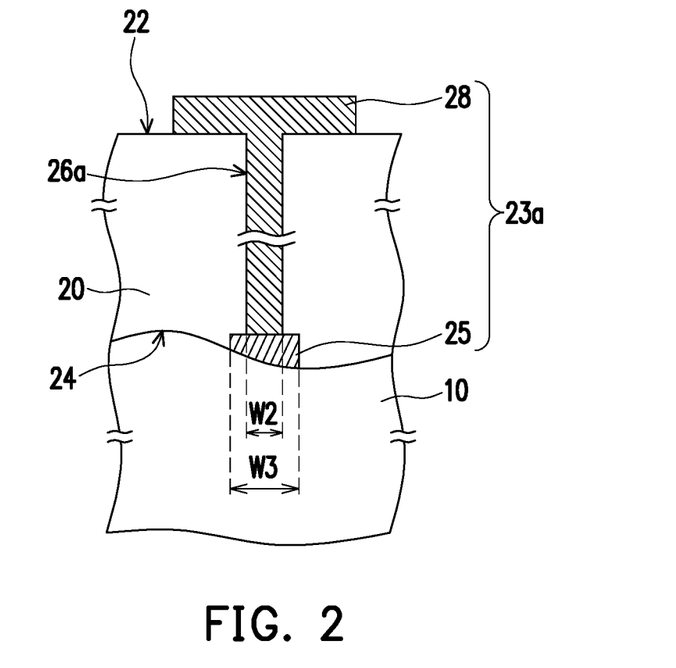
FIG. 2 to FIG. 7 are partial schematic cross-sectional diagrams of a plurality of micro light-emitting device modules according to other embodiments of the disclosure.

FIG. 1 is a partial schematic cross-sectional diagram of a micro light-emitting device module according to an embodiment of the disclosure. Referring to FIG. 1, a micro light-emitting device module 1 of the present embodiment includes a circuit substrate 10, a planarization layer 20, and a micro light-emitting device 31. It should be noted that a size of the micro light-emitting device 31 is very small. A maximum width of the micro light-emitting device 31 is between 1 μm and 100 μm, and is preferably between 1 μm and 20 μm. In order to clearly illustrate a relationship between the elements, FIG. 1 is a partial schematic microscopic diagram of the micro light-emitting device module. Microscopically, the circuit substrate 10 has a relatively waved contour.

In the present embodiment, the circuit substrate 10 is a multilayer circuit substrate, and a material may include fiberglass, an epoxy resin (Epoxy), a polyester resin (PET), polyethylene naphthalate (PEN), or polyimide (PI). The material of the circuit substrate 10 is not limited to the above. A circuit (not shown) electrically connected to the micro light-emitting device 31 is disposed in each layer of circuit. The multilayer circuit substrate is, for example, a hard printed circuit substrate or a flexible printed circuit substrate. The circuit substrate 10 in the present embodiment includes, for example, a three-layer circuit, but is not limited to the above.

The planarization layer 20 is disposed on an upper surface 12 of the circuit substrate 10 and includes a first surface 22 and a second surface 24 opposite to each other. The second surface 24 of the planarization layer 20 is in contact with the upper surface 12 of the circuit substrate 10. The micro light-emitting device 31 is disposed on the first surface 22 of the planarization layer 20. In the present embodiment, the micro light-emitting device 31 is, for example, a micro light-emitting diode, and may be a horizontal light-emitting diode or a vertical light-emitting diode, but a type of the micro light-emitting device 31 is not limited thereto.

Because the second surface 24 of the planarization layer 20 is in contact with the upper surface 12 of the circuit substrate 10, a contour of the second surface 24 of the planarization layer 20 corresponds to a contour of the upper surface 12 of the circuit substrate 10, so that a maximum height difference L1 of the second surface 24 of the planarization layer 20 is the same as a maximum height difference of the upper surface 12 of the circuit substrate 10.

In the present embodiment, the micro light-emitting device module 1 is applied to, for example, a display apparatus, and the micro light-emitting device 31 is, for example, a micro light-emitting diode. The maximum height difference L1 of the second surface 24 of the planarization layer 20 may be defined as a maximum height difference in one unit area (for example, an area of one pixel, a display region of the display panel or an area where the micro light-emitting devices 31 are transferred from a carrier in a transferring step), and the area of one pixel includes, for example, one or more micro light-emitting devices 31. Certainly, in other embodiments, the maximum height difference L1 of the second surface 24 of the planarization layer 20 may be alternatively a maximum height difference of the second surface 24 of the entire or partial planarization layer 20, and the maximum height difference L1 of the second surface 24 of the planarization layer 20 is not limited to the above.

It can be learned from FIG. 1 that in the present embodiment, the maximum height difference L1 of the second surface 24 of the planarization layer 20 is greater than a thickness H and a width W1 of the micro light-emitting device 31. In the present embodiment, a ratio of the thickness H of the micro light-emitting device 31 to the maximum height difference L1 of the second surface 24 of the planarization layer 20 is less than 0.5. The thickness H of the micro light-emitting device 31 is less than or equal to 5 µm, and the maximum height difference L1 of the second surface 24 of the planarization layer 20 is approximately between 10 µm and 600 µm. In addition, the maximum height difference L1 of the second surface 24 of the planarization layer 20 is greater than a maximum height difference L2 of the first surface 22 of the planarization layer 20.

Because the size of the micro light-emitting device 31 is too small and heating and pressurizing are performed when the micro light-emitting device 31 is disposed on the circuit substrate 10, when the maximum height difference L1 of the upper surface 12 of the circuit substrate 10 is greater than the thickness H of the micro light-emitting device 31, it is quite difficult to directly dispose the micro light-emitting device 31 on the circuit substrate 10. In particular, the circuit substrate 10 is formed by a multilayer structure, causing a considerable height difference of the upper surface of the circuit substrate 10. When the micro light-emitting device 31 is a flip-chip type micro light-emitting device or a horizontal type micro light-emitting device, during a process that the micro light-emitting device 31 is connected to the circuit substrate 10, more than two pads of the micro light-emitting device 31 are connected to the first pads 25 of the circuit substrate 10 which are located at different hight levels, such that the connection between the micro light-emitting device 31 and the circuit substrate 10 is more difficult. In the micro light-emitting device module 1 of the present embodiment, the planarization layer 20 is disposed on the upper surface 12 of the circuit substrate 10 to reduce a height difference, reduce a difficulty in disposing the micro light-emitting device 31, and reduce a probability of damaging the micro light-emitting device 31. Especially for the flip-chip type micro light-emitting device or the horizontal type micro light-emitting device, a hight difference between the pads of the flip-chip type micro light-emitting device or the horizontal type micro light-emitting device is less than a height difference of the upper surface 12 of the circuit substrate 10.

In the present embodiment, because the maximum height difference L2 of the first surface 22 of the planarization layer 20 is less than the thickness H of the micro light-emitting device 31, the micro light-emitting device 31 can be disposed on the first surface 22 of the planarization layer 20 relatively stably and without tilting to obtain a better electrical connection. In addition, in the present embodiment, a ratio of the maximum height difference L2 of the first surface 22 of the planarization layer 20 to the maximum height difference L1 of the second surface 24 of the planarization layer 20 is less than or equal to 0.1, so that the micro light-emitting device 31 can be disposed on the first surface 22 of the planarization layer 20 relatively stably. Certainly, the ratio of the maximum height difference L2 of the first surface 22 of the planarization layer 20 to the maximum height difference L1 of the second surface 24 of the planarization layer 20 is not limited to the above.

In addition, in the present embodiment, a Young's modulus of the planarization layer 20 is greater than that of the circuit substrate 10 to provide a support for the micro light-emitting device 31 during engagement. The planarization layer 20 may be made of a material with high heat resistance, high mechanical strength, high size stability, and excellent chemical resistance. The planarization layer 20 includes, for example, a polymer material such as Benzocyclobutene (BCB), polyimide (PI), or an organic rubber. In an embodiment, the planarization layer 20 may alternatively include a highly reflective material or a polymer material including a reflective particle to enhance an upward light-emitting effect of the micro light-emitting device module.

In the present embodiment, the micro light-emitting device module 1 includes a conductive structure 23 on the planarization layer 20, and the conductive structure 23 includes a first pad 25 and a second pad 28. The first pad 25 is disposed on the upper surface 12 of the circuit substrate 10 and is located in the planarization layer 20. The planarization layer 20 includes a via 26, and the first pad 25 and the second pad 28 are connected to the via 26. A shape of the via 26 is, for example, a cylinder, a conical cylinder, or an inverted conical cylinder, but the shape of the via 26 is not limited thereto.

In the present embodiment, the first pad 25 and the second pad 28 are not integrally formed. In other words, the first pad 25 and the second pad 28 are not manufactured in a same manufacture process. In the present embodiment, the first pad 25 is made of a material, for example, different from that of the second pad 28, but is not limited thereto. In addition, a resistance of the first pad 25 is greater than that of the second pad 28. In other words, the second pad 28 may be made of a material with a small resistance to enhance a conductive effect. Certainly, in an embodiment, the material of the first pad 25 may be alternatively the same as the material of the second pad 28. A relative resistance relationship is adjusted by changing a size, and a resistance is smaller if a size is larger. It should be particularly noted that, the Young's modulus of the first pad 25 may be greater than that of the second pad 28 to provide a manufacture buffer for the micro light-emitting device 31 during engagement.

In addition, the micro light-emitting device 31 includes a third pad 32 electrically connected to the second pad 28. In the present embodiment, an area of a projection of the second pad 28 onto the circuit substrate 10 is greater than that of a projection of the third pad 32 onto the circuit substrate 10, and the area of the projection of the third pad 32 onto the circuit substrate 10 is greater than that of a projection of the first pad 25 onto the circuit substrate 10. In other words, a width of the second pad 28 is greater than that of the third pad 32, and the width of the third pad 32 is greater than that of the first pad 25. In an embodiment not drawn, the area of the projection of the third pad 32 onto the circuit substrate 10 may be less than that of the projection of the first pad 25 onto the circuit substrate 10. As long as the width of the second pad 28 is greater than that of the third pad 32, a manufacture yield and a manufacture engagement margin when the third pad 32 is engaged with the second pad 28 can be increased.

A ratio of an area of a projection of the second pad 28 onto the circuit substrate 10 to an area of a projection of the first pad 25 onto the circuit substrate 10 is greater than 1 and less than or equal to 10. Such a design can increase an engagement margin of the micro light-emitting device 31, and the micro light-emitting device 31 can be easily aligned and engaged with the second pad 28. In addition, because the ratio of the area of the projection of the second pad 28 onto the circuit substrate 10 to the area of the projection of the first pad 25 onto the circuit substrate 10 does not exceed 10, a waste of wiring space on the first surface 22 of the planarization layer 20 can be avoided. However, this is not limited herein.

Generally, the circuit substrate 10 may be bent or warped such that a height of an edge portion of the circuit substrate 10 is different from that of a central portion, and the planarization layer 20 on the circuit substrate 10 may be used to compensate for the bending or warping of the circuit substrate 10. It can be learned from FIG. 1 that, because the circuit substrate 10 is bent or warped, the height of the edge portion is greater than that of the central portion, and a thickness of the planarization layer 20 at the edge portion is correspondingly less than that at the central portion. Therefore, a length L3 of one of two vias 26 of the planarization layer 20 that is closer to an edge of the planarization layer 20 (for example, a left via 26) is less than a length L4 of one of the two vias 26 that is farther from the edge of the planarization layer 20 (for example, a right via 26). Through the cooperation of the thickness of the planarization layer 20 and the height of the the circuit substrate 10, the circuit substrate 10 which is bent or warped can be compensated by the planarization layer 20 so as to improve the yield rate.

In addition, in the present embodiment, the micro light-emitting device module 1 further includes a chip 40 disposed on a lower surface 14 of the circuit substrate 10 or the first surface 22 of the planarization layer 20 and electrically connected to the micro light-emitting device 31 using a chip pad 42. The chip 40 may be an integrated circuit control chip 40 of the micro light-emitting device 31, but a type of the chip 40 is not limited thereto.

A micro light-emitting device module in another pattern is described below. Same or similar elements as the previous embodiment are denoted by same or similar symbols. The descriptions thereof are omitted herein, and only main differences are described.

FIG. 2 to FIG. 7 are partial schematic cross-sectional diagrams of a plurality of micro light-emitting device modules 1 according to other embodiments of the disclosure. First, referring to FIG. 2, a main difference between a conductive structure 23a in FIG. 2 and the conductive structure 23 in FIG. 1 lies in that, in the present embodiment, the planarization layer 20 extends to a portion of a top surface of the first pad 25, so that an area of a projection of the first pad 25 onto the circuit substrate 10 is greater than that of a projection of a via 26a onto the circuit substrate 10. It can be learned from FIG. 2 that, a width W3 of the first pad 25 is greater than a width W2 of the via 26a. Such a design can increase a contact area between the conductive structure 23a and the planarization layer 20, and the conductive structure 23a can be more stably disposed in the planarization layer 20.

Figure 3:
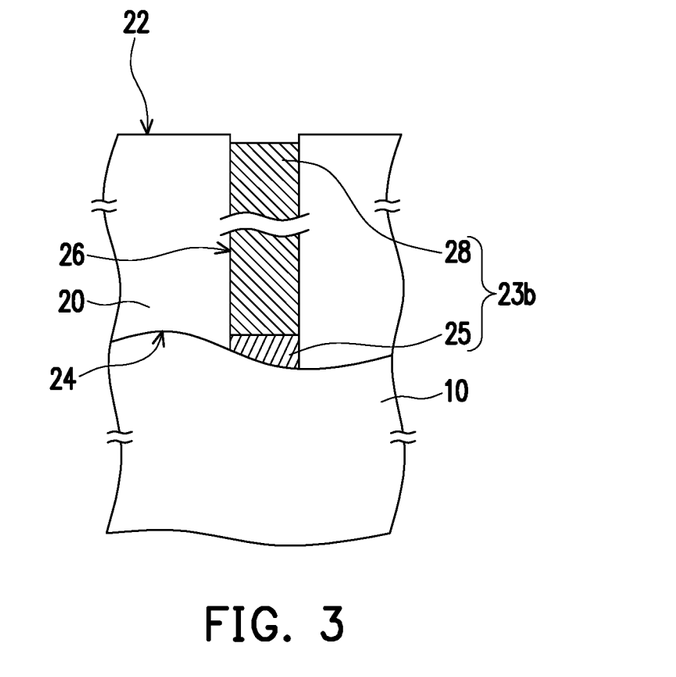

Referring to FIG. 3, a main difference between a conductive structure 23b in FIG. 3 and the conductive structure 23 in FIG. 1 lies in that, in the present embodiment, the conductive structure 23b is recessed in the first surface 22 of the planarization layer 20. More specifically, in the present embodiment, the conductive structure 23b includes the first pad 25 and the second pad 28, and the second pad 28 is slightly lower than the first surface 22 of the planarization layer 20. Thereafter, when the micro light-emitting device 31 (FIG. 1) is disposed on a via of the conductive structure 23b, the micro light-emitting device 31 may be electrically connected to the conductive structure 23b using a structure such as a solder ball or a bump. Such a design may cause the structure such as the solder ball or the bump to fill the recess, thereby reducing a probability of a short-circuit occurring on the first surface 22 of the planarization layer 20 due to overflow. In an embodiment, the second pad 28 of the conductive structure 23b may be alternatively flush with the first surface 22 of the planarization layer 20.

Figure 4:
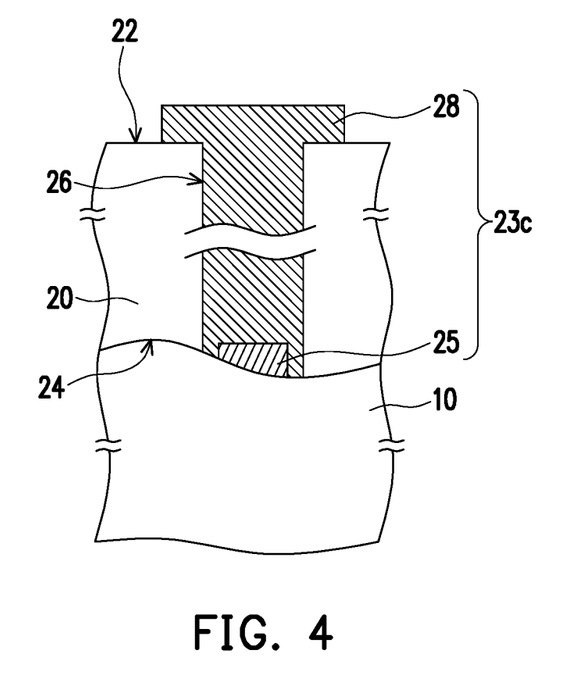

Referring to FIG. 4, a main difference between a conductive structure 23c in FIG. 4 and the conductive structure 23 in FIG. 1 lies in that, in the present embodiment, a second pad 28c covers the first pad 25. More specifically, in the present embodiment, a width of the second pad 28c in the via 26 is greater than that of the first pad 25, and the second pad 28c covers a top surface and a periphery of the first pad 25. Such a design can reduce a resistance of the conductive structure 23c and improve electrical efficiency.

Figure 5:
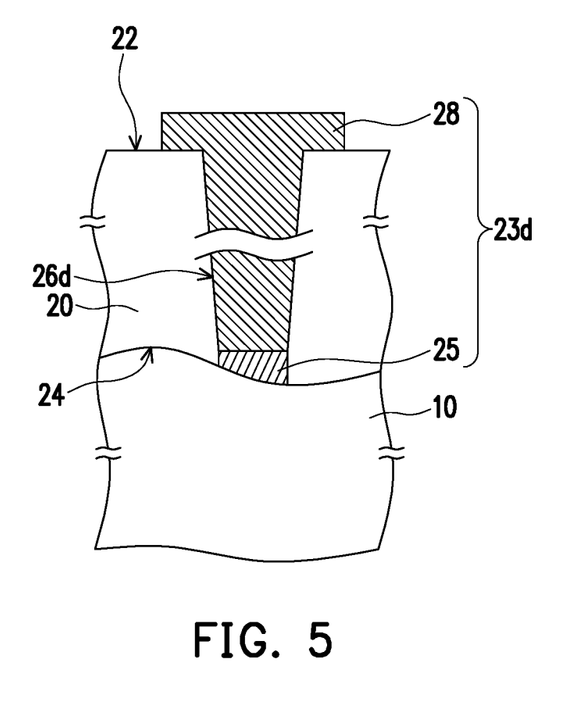

Referring to FIG. 5, a main difference between a conductive structure 23d in FIG. 5 and the conductive structure 23 in FIG. 1 lies in that, in the present embodiment, a via 26d is a conical cylinder. A size of the via 26d near the second pad 28 is greater than that of the via 26d near the first pad 25, and the via 26d is in a form with a wide top and a narrow bottom, so that the second pad 28 has a better manufacture yield. Certainly, in an embodiment, the via 26d may be alternatively in an inverted conical cylinder shape with a narrow top and a wide bottom.

Figure 6:
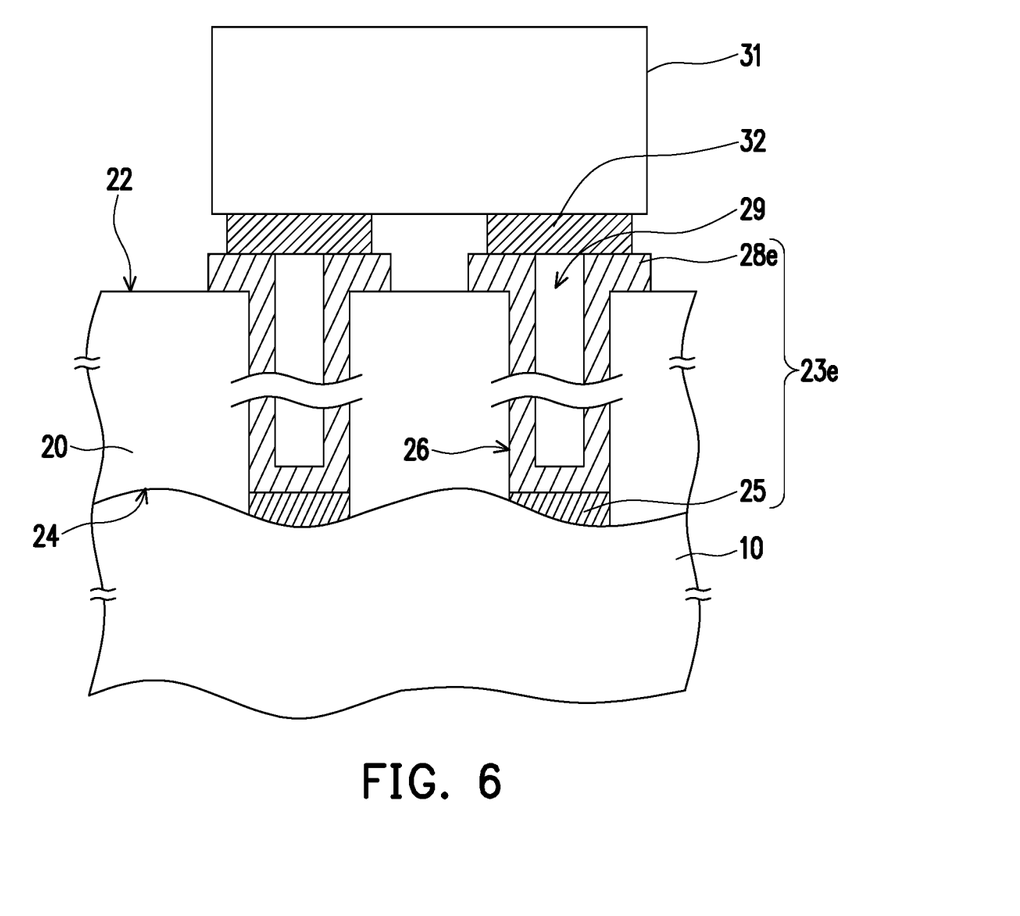

Referring to FIG. 6, a main difference between a conductive structure 23e in FIG. 6 and the conductive structure 23 in FIG. 1 lies in that, in the present embodiment, a second pad 28e includes a groove 29 facing the third pad 32. The third pad 32 covers the second pad 28e to seal the groove 29. In such a design, a buffer can be provided for the micro light-emitting device 31 engaged with the second pad 28e. In addition, a room is also provided for a part of the third pad 32, which is melted by high temperature and high pressure during the connecting process, to flow in, such that the situation which the melted part of the third pad 32 overflows to cause stort circuit can be prevented.

Figure 7:
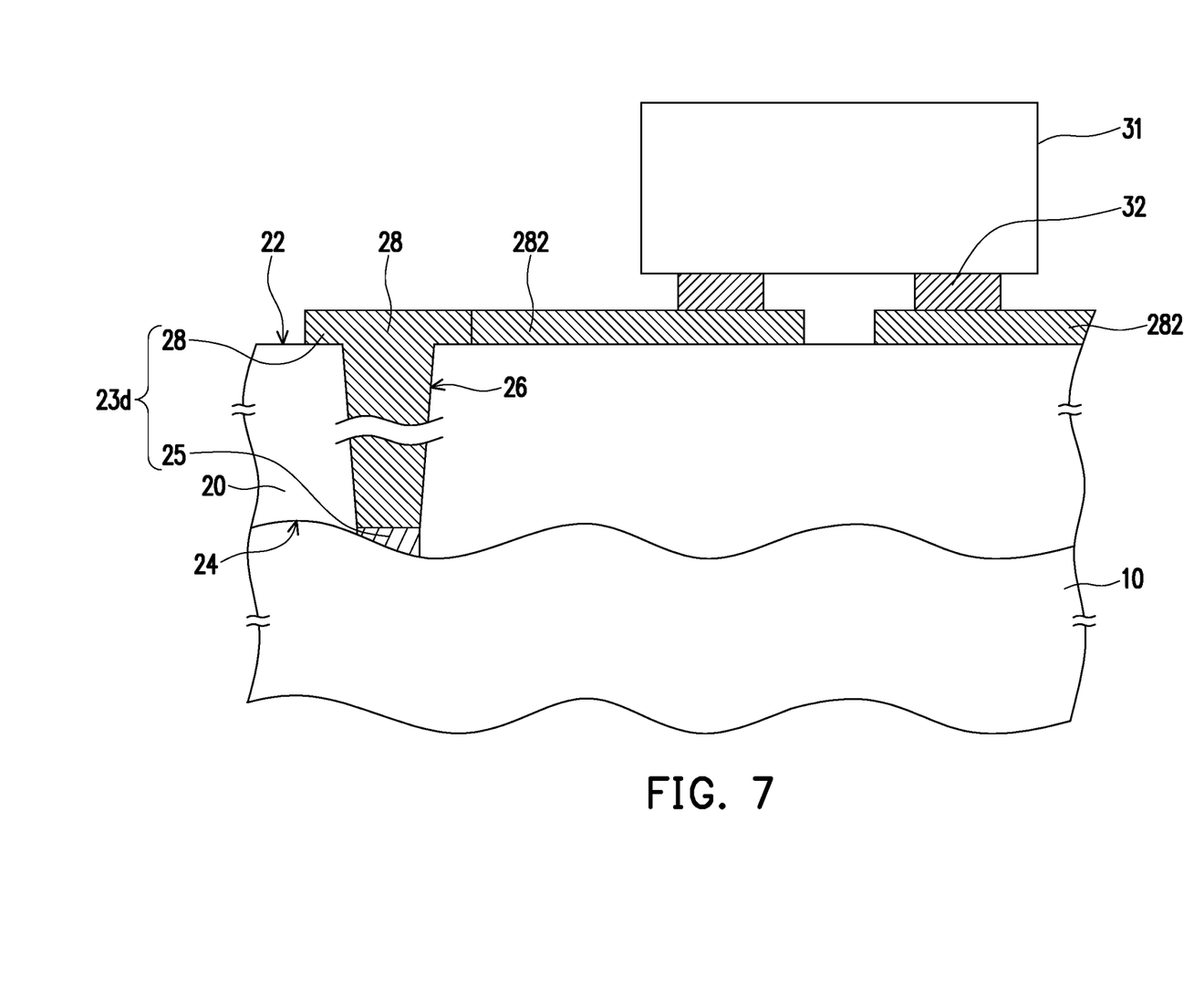

Referring to FIG. 7, in the present embodiment, a projection of the micro light-emitting device 31 onto the circuit substrate 10 does not overlap a projection of the via 26 onto the circuit substrate 10 or a projection of the first pad 25 onto the circuit substrate 10. The third pad 32 of the micro light-emitting device 31 is electrically connected to a circuit 282 on the first surface 22 of the planarization layer 20, the circuit 282 extends to a region outside a projection range of the micro light-emitting device 31 and is electrically connected to the second pad 28, and the second pad 28 is electrically connected to the first pad 25 located directly below. Because the micro light-emitting device 31 is away from the first pad 25, the planarization layer 20 has better flatness at a portion connected to the micro light-emitting device 31, so that the micro light-emitting device 31 can be more accurately engaged with the circuit 282 without tilting. Therefore, the micro light-emitting device module 1 can have good reliability and an engagement yield.

Figure 8:
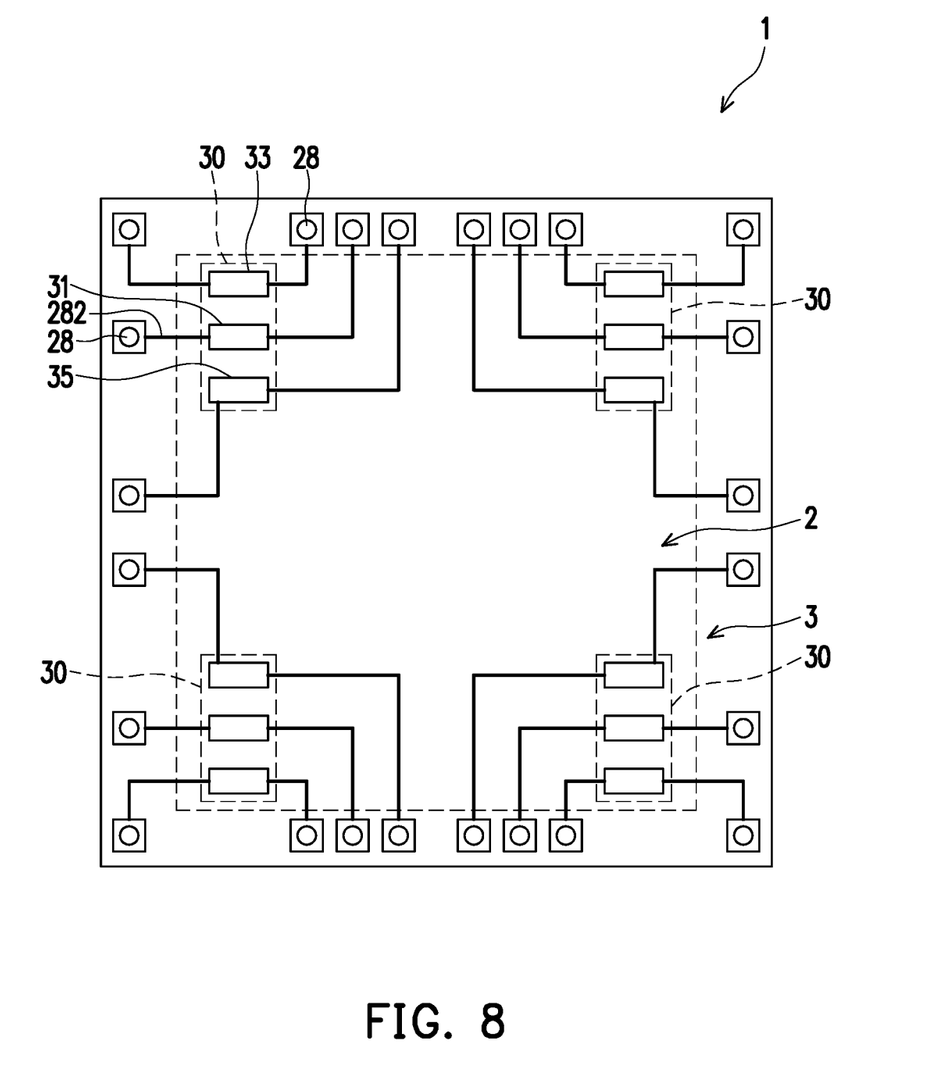
FIG. 8 is a schematic top view of the micro light-emitting device module in FIG. 7.

FIG. 8 is a schematic top view of the micro light-emitting device module in FIG. 7. Referring to FIG. 7 and FIG. 8, in the present embodiment, the micro light-emitting device module 1 is, for example, a micro light-emitting device display panel having a central display region 2 and a peripheral non-display region 32. The micro light-emitting device display panel may include other components depending on application of the micro light-emitting device display panel. These other components include (but are not limited to) a memory, a touch screen controller, and a battery. In other embodiments, a micro light-emitting device display may be a television, a tablet computer, a telephone, a laptop computer, a computer monitor, a stand-alone terminal service desk, a digital camera, a handheld game console, a media display, an ebook display, a vehicle display, or a large-area electronic kanban display. Micro light-emitting devices 31, 33, 35 are disposed in a device arrangement region 30, and the device arrangement region 30 is located in the display region 2. The micro light-emitting devices 31, 33, 35 in the device arrangement region 30 are connected to the second pad 28 in the non-display region 32 using the circuit 282. The micro light-emitting devices 31, 33, 35 are, for example, red, green, or blue micro light-emitting diodes, but types of the micro light-emitting devices 31, 33, and 35 are not limited thereto.

Figure 9:
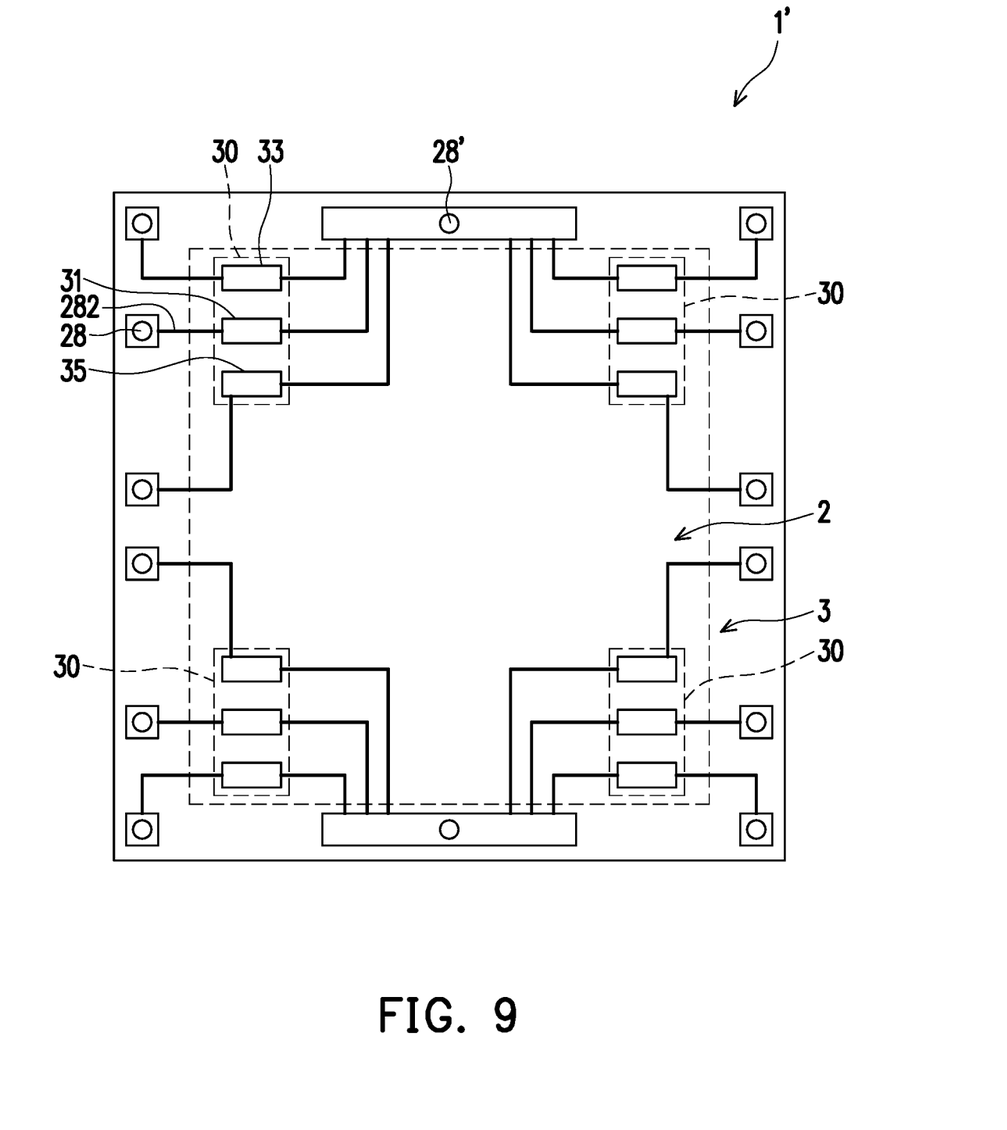
FIG. 9 is a schematic top view of a micro light-emitting device module according to another embodiment of the disclosure.

FIG. 9 is a schematic top view of a micro light-emitting device module according to another embodiment of the disclosure. Referring to FIG. 9, a main difference between a micro light-emitting device module 1' in FIG. 9 and the micro light-emitting device module 1 in FIG. 8 lies in that, in the present embodiment, micro light-emitting devices 31, 33, 35 at an upper-left position in FIG. 9 are connected to a same second pad 28' at an upper position in FIG. 9. In this case, compared to the case in which the micro light-emitting devices 31, 33, 35 in FIG. 8 are separately controlled, the micro light-emitting devices 31, 33, 35 at the upper-left position in FIG. 9 can be collectively controlled.

As described above, in the micro light-emitting device module of the disclosure, the planarization layer is disposed on the upper surface of the circuit substrate, and the second surface of the planarization layer is in contact with the upper surface of the circuit substrate. A contour of the second surface of the planarization layer corresponds to a contour of the upper surface of the circuit substrate (in other words, the maximum height difference of the second surface of the planarization layer is the same as a maximum height difference of the upper surface of the circuit substrate). Because the maximum height difference of the upper surface of the circuit substrate is greater than the thickness of the micro light-emitting device, it is quite difficult to directly dispose the micro light-emitting device on the circuit substrate. In the micro light-emitting device module of the disclosure, the planarization layer is disposed on the upper surface of the circuit substrate to reduce a height difference, reduce a difficulty in disposing the micro light-emitting device, and reduce a probability of damaging the micro light-emitting device.

In addition, compared to a general light-emitting diode technology, the micro light-emitting device is reduced from a millimeter scale to a micrometer scale. Therefore, the micro light-emitting device display can achieve high resolution and reduce power consumption of the display, and is more energy-saving and is simple and thin in mechanism.

What is claimed is:

1. A micro light-emitting device module, comprising:
   a circuit substrate;
   a planarization layer disposed on an upper surface of the circuit substrate and comprising a first surface and a second surface opposite to each other, wherein the second surface is in contact with the upper surface of the circuit substrate; and
   a micro light-emitting device disposed on the first surface of the planarization layer, wherein a maximum height difference of the second surface of the planarization layer is greater than a thickness of the micro light-emitting device,
   a conductive structure electrically connected to the circuit substrate and the micro light-emitting device, wherein the conductive structure comprises a first pad disposed on the upper surface of the circuit substrate and located in a via of the planarization layer, the first pad is connected to a second pad of the first surface of the planarization layer in the via.

2. The micro light-emitting device module according to claim 1, wherein the maximum height difference of the second surface of the planarization layer is greater than a maximum height difference of the first surface of the planarization layer.

3. The micro light-emitting device module according to claim 2, wherein a ratio of the maximum height difference of the first surface of the planarization layer to the maximum height difference of the second surface of the planarization layer is less than or equal to 0.1.

4. The micro light-emitting device module according to claim 1, wherein a maximum height difference of the first surface of the planarization layer is less than the thickness of the micro light-emitting device.

5. The micro light-emitting device module according to claim 1, wherein a ratio of the thickness of the micro light-emitting device to the maximum height difference of the second surface of the planarization layer is less than 0.5.

6. The micro light-emitting device module according to claim 1, wherein the maximum height difference of the second surface of the planarization layer is greater than a width of the micro light-emitting device.

7. The micro light-emitting device module according to claim 1, wherein the first pad and the second pad are not integrally formed.

8. The micro light-emitting device module according to claim 1, wherein a material of the first pad is different from a material of the second pad.

9. The micro light-emitting device module according to claim 1, wherein a resistance of the first pad is greater than a resistance of the second pad.

10. The micro light-emitting device module according to claim 1, wherein a ratio of an area of a projection of the second pad onto the circuit substrate to an area of a projection of the first pad onto the circuit substrate is greater than 1 and less than or equal to 10.

11. The micro light-emitting device module according to claim 1, wherein the micro light-emitting device comprises a third pad electrically connected to the second pad, an area of a projection of the second pad onto the circuit substrate being greater than an area of a projection of the third pad onto the circuit substrate, and the area of the projection of the third pad onto the circuit substrate being greater than an area of a projection of the first pad onto the circuit substrate.

12. The micro light-emitting device module according to claim 1, wherein the planarization layer extends to a portion of a top surface of the first pad.

13. The micro light-emitting device module according to claim 1, wherein an area of a projection of the second pad onto the circuit substrate is greater than an area of a projection of the first pad onto the circuit substrate, and the area of the projection of the first pad onto the circuit substrate is greater than an area of a projection of the via onto the circuit substrate.

14. The micro light-emitting device module according to claim 1, wherein the second pad covers the first pad.

15. The micro light-emitting device module according to claim 1, wherein the micro light-emitting device comprises a third pad electrically connected to the second pad, and the second pad comprises a groove facing the third pad.

16. The micro light-emitting device module according to claim 1, wherein a projection of the micro light-emitting device onto the circuit substrate does not overlap a projection of the via onto the circuit substrate.

17. The micro light-emitting device module according to claim 1, wherein a projection of the micro light-emitting device onto the circuit substrate does not overlap a projection of the first pad onto the circuit substrate.

18. The micro light-emitting device module according to claim 1, wherein the second pad is recessed in or flush with the first surface of the planarization layer.

19. The micro light-emitting device module according to claim 1, wherein the planarization layer comprises at least two vias, a length of one of the at least two vias that is close to an edge of the planarization layer being less than a length of one of the at least two vias that is far away from the edge of the planarization layer.

20. The micro light-emitting device module according to claim 1, wherein a Young's modulus of the planarization layer is greater than a Young's modulus of the circuit substrate.

\* \* \* \* \*